United States Patent
Kim

(10) Patent No.: US 8,144,443 B2
(45) Date of Patent: Mar. 27, 2012

(54) DISCHARGING CONTROL APPARATUS OF SWITCHING DEVICE FOR INVERTER

(75) Inventor: Jin-Hong Kim, Chungcheongbuk-Do (KR)

(73) Assignee: LS Industrial Systems Co., Ltd., Gyeonggi-do (KR)

( * ) Notice: Subject to any disclaimer, the term of this patent is extended or adjusted under 35 U.S.C. 154(b) by 506 days.

(21) Appl. No.: 12/251,613

(22) Filed: Oct. 15, 2008

(65) Prior Publication Data

US 2009/0116154 A1    May 7, 2009

(30) Foreign Application Priority Data

Nov. 6, 2007  (KR) .................. 10-2007-0112729

(51) Int. Cl.
*H02H 3/08* (2006.01)
*H03K 3/00* (2006.01)
(52) U.S. Cl. ....................... 361/93.1; 327/108
(58) Field of Classification Search .......... 361/93.1; 327/108
See application file for complete search history.

(56) References Cited

U.S. PATENT DOCUMENTS

| | | | | |
|---|---|---|---|---|
| 5,448,441 A | * | 9/1995 | Raposa | 361/18 |
| 5,525,925 A | * | 6/1996 | Bayer | 327/377 |
| 6,097,582 A | * | 8/2000 | John et al. | 361/79 |
| 6,275,093 B1 | * | 8/2001 | Shekhawat et al. | 327/434 |
| 6,661,260 B2 | * | 12/2003 | Nakahara et al. | 327/109 |
| 6,687,106 B1 | * | 2/2004 | Tanaka et al. | 361/101 |
| 7,817,392 B2 | * | 10/2010 | Lee et al. | 361/89 |
| 2005/0077948 A1 | * | 4/2005 | Kojima | 327/427 |
| 2006/0119311 A1 | | 6/2006 | Lee | |
| 2006/0255762 A1 | | 11/2006 | Yun | |
| 2007/0030615 A1 | * | 2/2007 | Ishikawa et al. | 361/100 |
| 2007/0127170 A1 | | 6/2007 | Park | |
| 2007/0152676 A1 | | 7/2007 | Lee | |

* cited by examiner

*Primary Examiner* — Jared Fureman
*Assistant Examiner* — Scott Bauer
(74) *Attorney, Agent, or Firm* — Greenblum & Bernstein, P.L.C.

(57) ABSTRACT

Disclosed is a discharging control apparatus of a switching device for an inverter capable of reducing a spike voltage when the switching device is turned off and reducing a turn-off time of the switching device, the apparatus comprising, a fast discharge circuit section configured to provide a discharging path through which a gate voltage of the switching device is fast discharged at a first discharging speed, an idle discharge circuit section configured to provide a discharging path through which the gate voltage of the switching device is idly discharged at a second discharging speed slower than the first discharging speed, and a spike voltage reduction controller configured to control such that the gate voltage is discharged simultaneously via the fast discharge circuit section and the idle discharge circuit section, when the switching device is turned off in the state that a normal current flows in the switching device, so as to reduce a spike voltage and simultaneously fast turn the switching device off.

8 Claims, 4 Drawing Sheets

DISCHARGING CONTROL APPARATUS OF SWITCHING DEVICE FOR INVERTER

RELATED APPLICATION

The present disclosure relates to subject matter contained in Korean Application No. 10-2007-0112729, filed on Nov. 6, 2007, which is herein expressly incorporated by reference in its entirety.

BACKGROUND OF THE INVENTION

1. Field of the Invention

The present invention relates to an inverter, and particularly, to a discharging control apparatus of a switching device for an inverter.

2. Background of the Invention

In general, an inverter is widely used to drive alternating current (AC) loads, such as a three-phase alternating current (AC) motor or the like. The inverter serves to convert a commercial AC voltage into a direct current (DC) voltage and to invert the DC voltage into AC voltage again. Wherein the converted DC voltage is switched by a switching device to be then inverted to the AC voltage again, so as to be supplied to a load, such as an AC motor. And the inverter can accurately control the velocity of the three-phase AC motor.

The switching device, namely, a power switching device, is usually configured by employing an insulating gate bipolar transistor (abbreviated IGBT hereinafter). In the inverter, particularly, in a large capacity inverter, the capacity of current which is switched by the switching device to be outputted to a load is very large. Thus, even during the normal operation of the inverter, a high level of spike voltage may be generated when the switching device is turned off. Such spike voltage may damage the switching device.

Hence, it is required to reduce the high level of spike voltage which is generated when the switching device switches a DC voltage in the large capacity inverter.

Hereinafter, an inverter to which the present invention is applied and a driving circuit of a switching device for an inverter will be described with reference to FIG. 1.

FIG. 1 is a circuit view showing a configuration of a general three-phase inverter. Here, a reference numeral 100 denotes a switching circuit section for switching a DC voltage to output an AC voltage to an AC load 110, such as an AC motor. The switching circuit section 100 includes totally 6 switching devices IGBT1 to IGBT6, one pair for each phase, in case where the load 110 is a three-phase load. Each two of 6 switching devices IGBT1 to IGBT6 are paired so as to be parallel-connected between a power source terminal VDC and a ground. Connection points of the switching device pairs (i.e., (IGBT1, IGBT2), (IGBT3, IGBT4) and (IGBT5, IGBT6)) are connected to the load 110.

A reference number 120 denotes a pulse width modulation (PWM) signal generating circuit for switching the switching device pairs (i.e., (IGBT1, IGBT2), (IGBT3, IGBT4) and (IGBT5, IGBT6)). For example, under the assumption that the switching circuit section 100 includes 6 switching devices IGBT1 to IGBT6, the PWM signal generating circuit 120 generates 6 PWM signals.

A reference numeral 130 denotes a plurality of gate driving units. The plurality of gate driving units 130 respectively switch the switching devices IGBT1 to IGBT6 of the switching circuit section 100 according to the PWM signals generated from the PWM signal generating circuit 120.

In the three-phase inverter with such configuration, the PWM signal generating circuit 120 generates PWM signals having high level voltage (logical 1) and low level voltage (logical 0) in an alternating manner. Each pair, namely, each two of the generated PWM signals, have a phase difference of 180° therebetween, and the paired PWM signals have a phase difference of 120° therebetween.

The generated PWM signals are input in the plurality of driving units 130. The driving units 130 apply or stop applying driving voltages to gates of the respective switching devices IGBT1 to IGBT6 of the switching circuit section 100 according to the PWM signals.

Each of the switching devices IGBT1 to IGBT6 is selectively turned on or off in a repetitive manner according to whether the gate driving voltage is applied. That is, the pairs of switching devices (i.e., (IGBT1, IGBT2), (IGBT3, IGBT4) and (IGBT5, IGBT6)) are alternately turned on or off in the repetitive manner. The pairs of switching devices (i.e., (IGBT1, IGBT2), (IGBT3, IGBT4) and (IGBT5, IGBT6)) are turned on or off with a phase difference of 120° therebetween.

In cooperation with the turn-on or turn-off of the plurality of switching devices IGBT1 to IGBT6, a DC voltage of the power source terminal VDC is converted (inverted) into an AC voltage, and the inverted AC voltage is supplied to the load 110 so as to drive the load 110.

Hereinafter, a configuration of the driving unit of the switching device according to the related art, including a discharge circuit of the switching device for the inverter, will be described with reference to FIG. 2.

As shown in FIG. 2, each gate driving unit 130 of the switching device according to the related art includes one charging path and a discharging path. The charging and discharging paths are connected in parallel between the PWM signal generating circuit 120 and the gate of each switching device IGBT as shown in FIG. 1. The charging path includes an NPN type transistor TR1 and a turn-on resistor R1 for restricting a charging current. The discharging path includes a PNP type transistor TR2 and a turn-off resistor R2 for restricting a discharging current.

The operation of the gate driving unit 130 of each switching device according to the related art having such configuration will now be described.

If the PWM signal generated from the PWM signal generating circuit (see 120 in FIG. 1) is a high level signal, the NPN type transistor TR1 is turned on such that a DC voltage of a (+) power source terminal Vcc is supplied to a base of the switching device IGBT via the turn-on resistor R1, thereby turning the switching device IGBT on. If the PWM signal generated from the PWM signal generating circuit (see 120 in FIG. 1) is a low level signal, the NPN type transistor is turned off and simultaneously the PNP type transistor TR2 is turned on, such that the DC voltage Vcc is not supplied to the base of the switching device IGBT any more, thereby turning the switching device IGBT off. In cooperation with the turn-off of the switching device IGBT, a gate voltage $V_{GE}$ having charged between an emitter of the switching device IGBT and the gate thereof is discharged to a (−) power source terminal Vee via the turn-off resistor R2 and the PNP type transistor TR2.

A discharging operation when a switching device is turned off, in a gate driving unit of a switching device according to the related art, will now be described with reference to FIG. 3.

First, as shown in FIG. 3(a), a low level PWM signal generated from the PWM signal generating circuit 120 is applied to the gate driving unit 130 at time t1 so as to turn the switching device IGBT off. Accordingly, the PNP type transistor TR2 is turned on, whereby a discharging current $I_G$ of the switching device IGBT is drastically increased to be maintained at a certain level. The discharging current $I_G$ starts to be decreased at time t2, a time at which the switching device IGBT is substantially turned off so as to become 0 (zero). Here, indicating the discharging current $I_G$ by a minus (−) value in FIG. 3(a) is intended to represent that the discharging current is discharged via the (−) power source terminal Vee upon the discharging.

FIG. 3(b) is a waveform view showing the change in a voltage $V_{GE}$ between gate and emitter (hereinafter, called 'gate voltage) of a switching device IGBT upon turning the switching device IGBT off. As shown in FIG. 3(b), the gate voltage $V_{GE}$ of the switching device IGBT is drastically decreased at the time t1 when the low level PWM signal generated from the PWM signal generating circuit 120 for turning the switching device IGBT off is applied to the PNP type transistor TR2. After being maintained at a certain level, such gate voltage $V_{GE}$ is then drastically decreased at the time t2 when the switching device IGBT is substantially turned off to become 0 (zero).

FIG. 3(c) is a waveform view showing the change in a voltage $V_{CE}$ between emitter and collector (hereinafter, emitter-collector voltage) of a switching device IGBT upon turning the switching device IGBT off.

As shown in FIG. 3(c), the emitter-collector voltage $V_{CE}$ of the switching device IGBT is gently increased to a voltage close to 0 (zero), during a period from the time t1 when the low level PWM signal generated from the PWM signal generating circuit 120 for turning the switching device IGBT off is applied to the PNP type transistor TR2 to the time t2 when the switching device IGBT is substantially turned off. The emitter-collector voltage $V_{CE}$ of the switching device IGBT is drastically increased at the time t2 when the switching device IGBT is substantially turned off, so as to become a DC voltage of the (+) power source terminal Vcc.

In the large capacity inverter having the gate driving units according to the related art, a current capacity switched by the switching device IGBT is very high, even when the switching device IGBT is turned off under the state that a normal current flows in the switching device IGBT, a high level spike voltage may be generated.

In order to reduce such spike voltage, a method of increasing the resistance value of the resistor 2 for discharging a gate current of the switching device IGBT is employed. However, the increase in the resistance value of the resistor R2 causes a turn-off time of the switching device IGBT to be extended, resulting in an increase in the loss of the switching device IGBT In addition, in the gate driving unit of the switching device for the inverter according to the related art, when turning the switching device off under the state that an over-current flows in the switching device, the spike voltage is much increased, thereby damaging the switching device (e.g., burning it out).

SUMMARY OF THE INVENTION

Therefore, an object of the present invention is to provide a discharging control apparatus of a switching device for an inverter capable of reducing a spike voltage, which is generated when the switching device is turned off in the state that a normal current flows in the switching device, and also of preventing an extension of a turn-off time of the switching device.

Another object of the present invention, there is provided a discharging control apparatus of a switching device for an inverter capable of preventing a damage of the switching device and reducing a spike voltage, by fast discharging a gate voltage when the switching device is turned off in the state that an over-current flows in the switching device.

In accordance with one aspect of the present invention, a discharging control apparatus of a switching device for an inverter may include: a fast discharge circuit section configured to provide a discharging path for fast discharging a gate voltage of the switching device at a first discharging speed; an idle discharge circuit section connected to the fast discharge circuit section in parallel and configured to provide a discharging path for idly discharging the gate voltage of the switching device at a second discharging speed slower than the first discharging speed; and a spike voltage reduction controller configured to control such that the gate voltage is discharged simultaneously via the fast discharge circuit section and the idle discharge circuit section, when the switching device is turned off in the state that a normal current flows in the switching device, so as to reduce a spike voltage and simultaneously fast turn the switching device off.

In accordance with another aspect of the present invention, there is provided discharging control apparatus of a switching device for an inverter may include: an over-current detecting circuit section configured to detect whether an over-current flows in the switching device; a first fast discharge circuit section configured to provide a discharging path through which a gate voltage of the switching device is fast discharged at a first discharging speed; an idle discharge circuit section connected to the fast discharge circuit section in parallel and configured to provide a discharging path through which the gate voltage of the switching device is idly discharged at a second discharging speed slower than the first discharging speed; a second fast discharge circuit section configured to provide a discharging path through which the gate voltage of the switching device is fast discharged at a third discharging speed faster than the first discharging speed; and a spike voltage reduction controller configured to control such that the gate voltage is discharged simultaneously via the first fast discharge circuit section and the idle discharge circuit section, when the switching device is turned off in the state that a normal current flows in the switching device, wherein when the switching device is turned off in the state that an over-current has been detected by the over-current detecting circuit section, the spike voltage reduction controller allows a fast discharge of the gate voltage of the switching device via the second fast discharge circuit section for a predetermined time, then allows an idle discharge of the gate voltage via the idle discharge circuit section for a next predetermined time, and finally allows a fast discharge of the gate voltage via the first fast discharge circuit section.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of configuration and operational effects of the present invention, with reference to the accompanying drawings.

The embodiment and accompanying drawings described herein are merely exemplary, and other various embodiments may be proposed within the scope of the present invention. Also, it should be understood such embodiment and accompanying drawings are not intended to limit the range of the present invention.

Hereinafter, description will be given of an exemplary configuration of a driving unit of a switching device, including a discharging control apparatus in a switching device for an inverter in accordance with a preferred embodiment of the present invention, with reference to FIG. 4.

Figure 4:
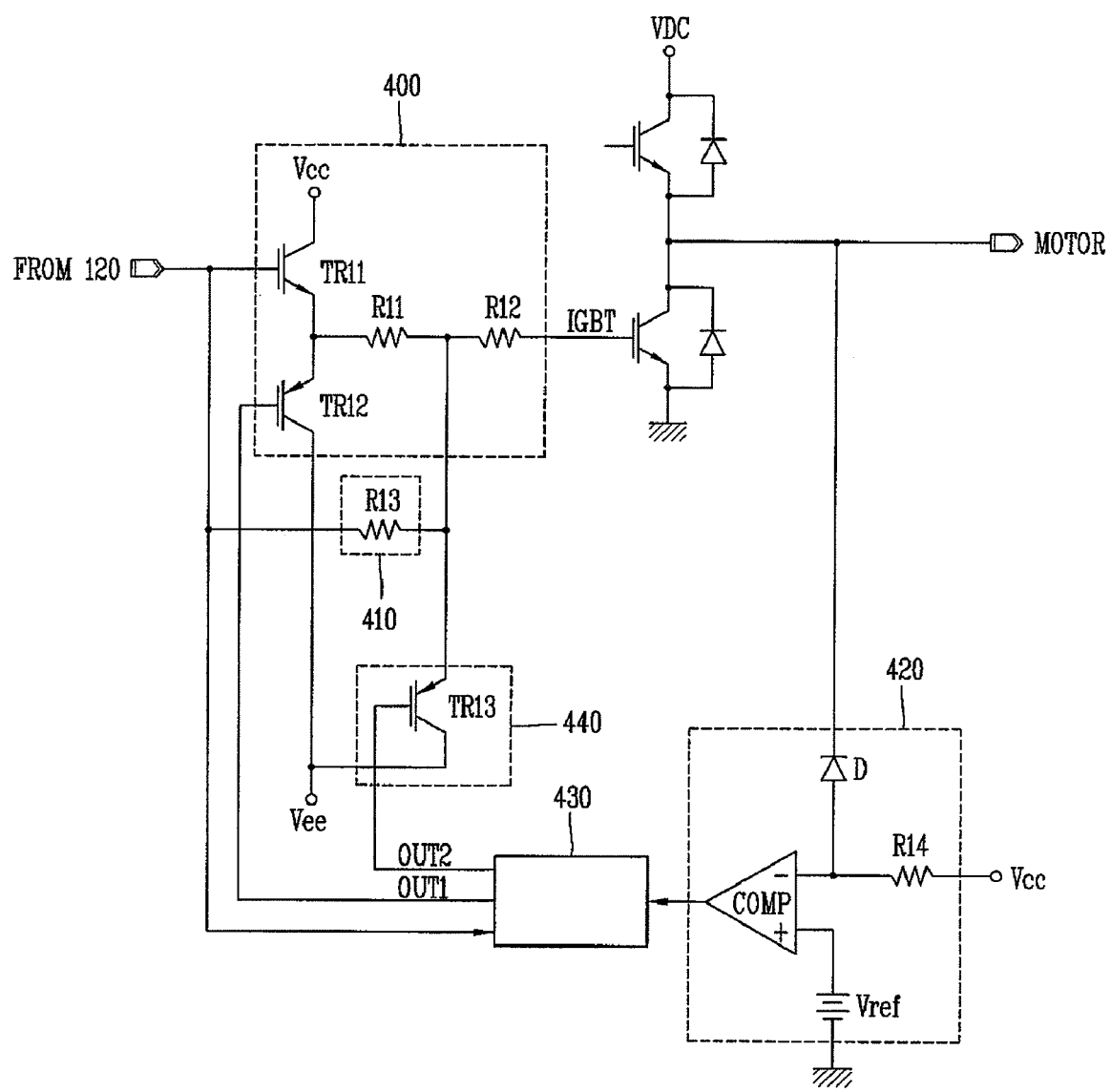
FIG. 4 is a circuit view showing a configuration of a driving unit of a switching device including a discharging control apparatus in a switching device for an inverter in accordance with a preferred embodiment of the present invention.

As shown in FIG. 4, a discharging control apparatus of a switching device for an inverter in accordance with a preferred embodiment of the present invention includes a first fast discharge circuit section (i.e., R11, R12 and TR12) for providing a discharging path through which a gate voltage, in detail, a gate-emitter voltage $V_{GE}$ of a switching device IGBT is fast discharged at a first discharging speed.

Figure 1:
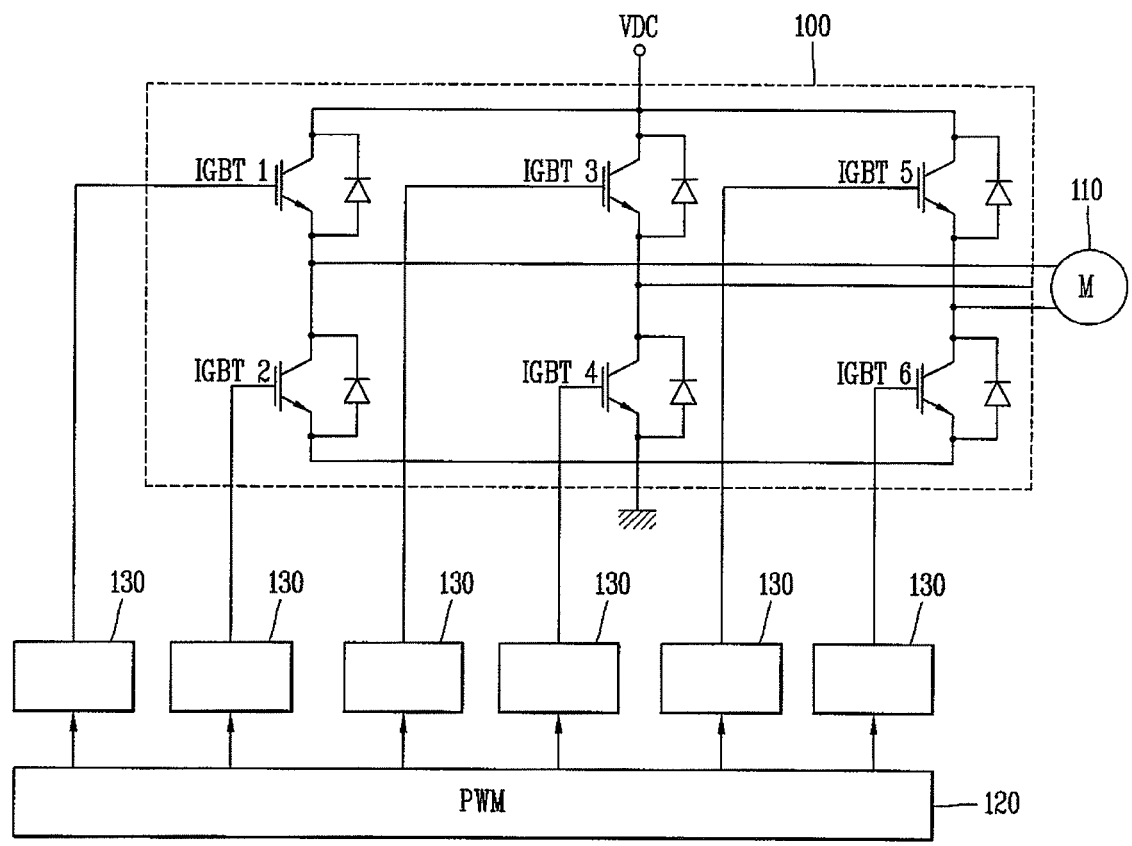
FIG. 1 is a circuit view showing a configuration of a general three-phase inverter.
Figure 2:
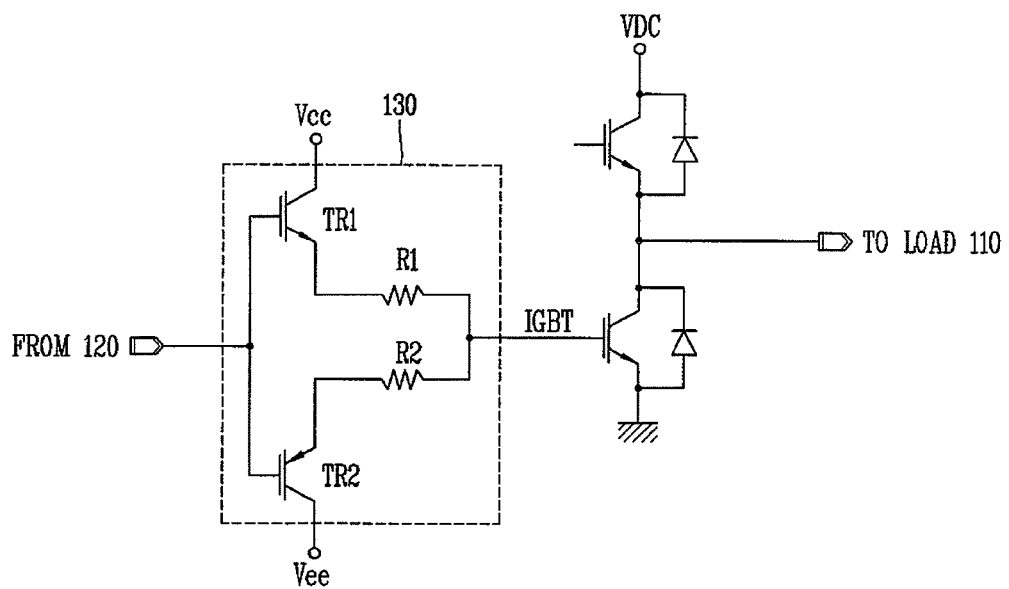
FIG. 2 is a circuit view showing an exemplary configuration of a driving unit of a switching device for an inverter according to the related art.
Figure 3:
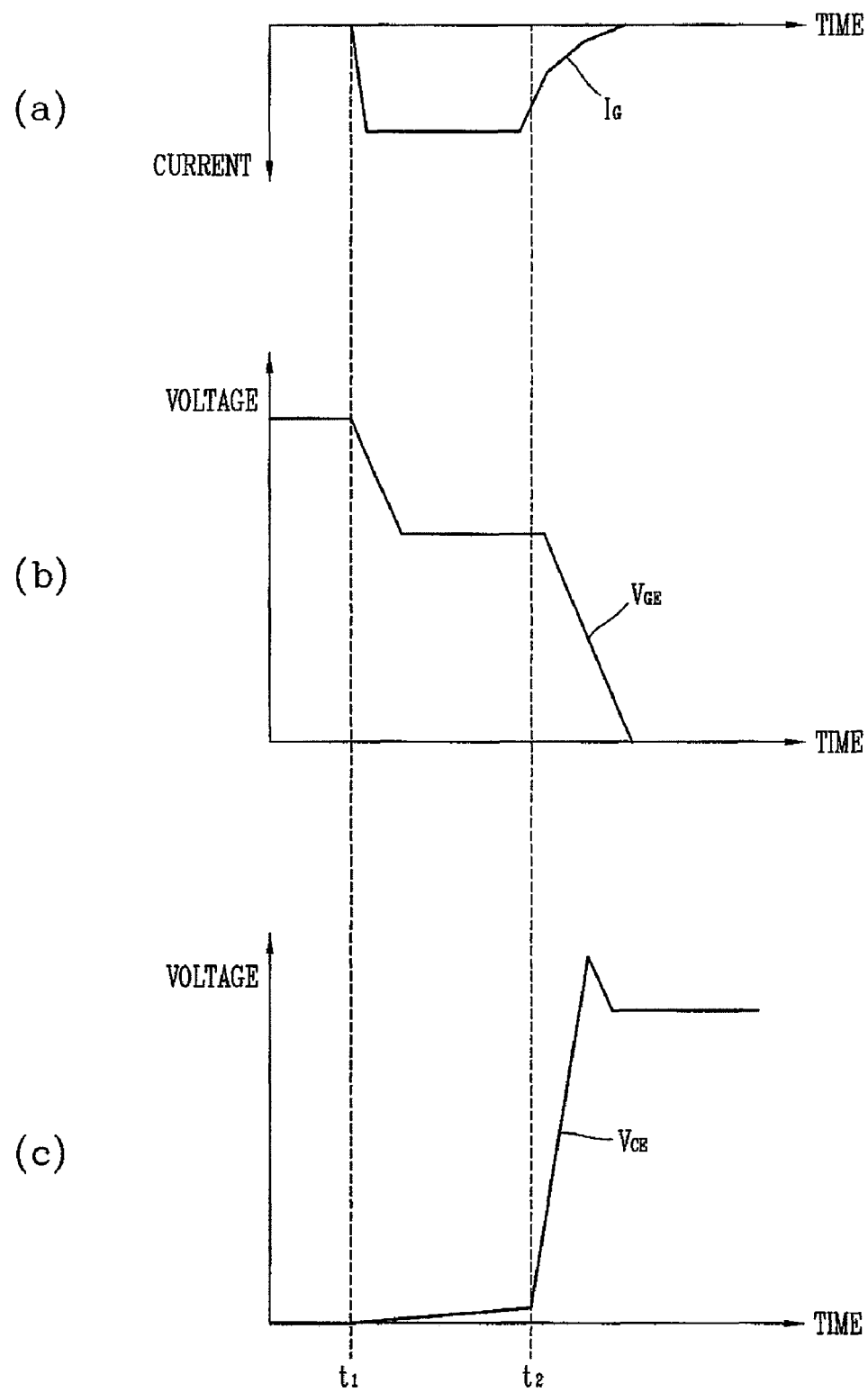
FIGS. 3a to 3c are waveform views showing an operation of the driving unit according to the related art.

As shown in FIG. 4, a gate driving circuit section 400 includes the first fast discharge circuit section (i.e., R11, R12 and TR12). The gate driving circuit section 400 applies or stops applying a gate driving voltage of a switching device (e.g., Insulated Gate Bipolar Transistor (IGBT)), thus to turn on or turn off the switching device IGBT according to a PWM signal generated from the PWM signal generating circuit section (see 120 in FIG. 1). In more detail, if the PWM signal generated from the PWM signal generating circuit section (see 120 in FIG. 1) is a high level signal, an NPN type transistor TR11 is turned on such that a DC voltage Vcc is supplied to a base of the switching device IGBT via the resistors R11 and R12, thereby turning the switching device IGBT on. If the PWM signal generated from the PWM signal generating circuit section (see 120 in FIG. 1) is a low level signal, an NPN type transistor TR11 is turned off such that a DC voltage Vcc is not supplied to a base of the switching device IGBT any more, thereby turning the switching device IGBT off.

The discharging control apparatus includes an idle discharge circuit section 410 connected to the fast discharge circuit section (i.e., R1, R12 and TR12) in parallel so as to provide a discharging path through which a gate voltage $V_{GE}$ of the switching device IGBT is idly discharged at a second discharging speed lower, in other words slower, than the first discharging speed when the switching device is turned off. The idle discharge circuit section 410 is configured to reduce a spike voltage generated at the switching device IGBT when the switching device IGBT is turned off under the state that a normal current flows in the switching device IGBT. The first fast discharge circuit section (i.e., R11, R12 and TR12) may include a resistor, i.e., R11 and/or R12, each or both having a first resistance. The first fast discharge circuit section R11, R12 and TR12 may further include the transistor TR12 switched according to the control of a spike voltage reduction controller 430. The transistor TR12 is configured as a PNP type transistor in the preferred embodiment. An emitter of the transistor TR12 is connected to the resistor R11 and an emitter of the transistor TR11. Also, the base of the transistor TR12 is connected to a first output terminal OUT1 of the spike voltage reduction controller 430, so as to be switched by the spike voltage reduction controller 430.

When the switching device IGBT is turned off in the state that a normal current flows in the switching device IGBT, a turn-off time of the switching device IGBT can be decreased by the first fast discharge circuit section (i.e., R11, R12 and TR12).

The idle discharge circuit section 410 may include a resistor R13 having a resistance greater than the first resistance.

Also, the discharging control apparatus further includes a spike voltage reduction controller 430. Accordingly, when the switching device IGBT is turned off in the state that a normal current flows in the switching device IGBT, the spike voltage reduction controller 430 controls such that the gate voltage $V_{GE}$ can be discharged via the first fast discharge circuit section (i.e., R11, R12 and TR12) and the idle discharge circuit section 410, thus to reduce the spike voltage and simultaneously allow a fast turn-off of the switching device IGBT The discharging control apparatus may further include an over-current detecting circuit section 420 for detecting whether an over-current flows in the switching device IGBT. The over-current detecting circuit section 420 may include a comparator COMP for compare the voltage $V_{CE}$ between emitter and collector (hereinafter, referred to as an emitter-collector voltage $V_{CE}$) of the switching device IGBT with a predetermined reference voltage $V_{REF}$ so as to detect an over-current generation. The over-current detecting circuit section 420 may further include a diode D connected between the emitter of the switching device IGBT and an inverting input terminal of the comparator COMP so as to detect the emitter-collector voltage $V_{CE}$, a pull-up resistor having one end connected to a DC voltage source Vcc and another end connected to the inverting input terminal of the comparator COMP, and a reference voltage source (see $V_{REF}$ of FIG. 4) for providing the reference voltage $V_{REF}$ to the comparator COMP.

The discharging control apparatus may further include a second fast discharge circuit section 440 providing a discharging path through which the gate voltage $V_{GE}$ of the switching device IGBT is fast discharged at a third discharging speed faster than the first discharging speed. The fast discharge circuit section 440 may include a transistor TR13 connected to a second output terminal OUT2 of the spike voltage reduction controller 430 for fast discharging the gate voltage $V_{GE}$ of the switching device IGBT according to the control of the spike voltage reduction controller 430.

According to this embodiment, when the switching device IGBT is turned off in the sate that a normal current flows in the switching device IGBT, the spike voltage reduction controller 430 within the discharging control apparatus controls such that the gate voltage $V_{GE}$ can be discharge simultaneously via the first fast discharge circuit section R11, R12 and TR12 and the idle discharge circuit section 410. However, when the switching device IGBT is turned off in the sate that the over-current detecting circuit section 420 has detected an over-current, the spike voltage reduction controller 430 controls such that the fast discharge of the gate voltage $V_{GE}$ of the switching device is first performed via the second fast discharge circuit section 440 for a predetermined time, the idle discharge of the gate voltage $V_{GE}$ of the switching device IGBT is then performed via the idle discharge circuit section 410 for a predetermined time, and finally the fast discharge of the gate voltage $V_{GE}$ is performed via the first fast discharge circuit section R11, R12 and TR12.

The spike voltage reduction controller 430 can be implemented by a microprocessor and/or the microprocessor and a pre-stored program upon the fabrication of the product.

In FIG. 4, explained reference numerals Vcc and Vee denote (+) power source terminal and (−) power source terminal, respectively. VDC denotes a voltage of a DC power source supplied to the switching device IGBT, and an AC output is provided to a motor via an output terminal between a pair of switching devices IGBT connected to each other in series.

Hereinafter, description will be given of a discharging operation of the discharging control apparatus of the switching device for an inverter in accordance with the preferred embodiment of the present invention, with reference to FIGS. 4 and 5.

First, the discharging operation of the discharging control apparatus according to the present invention will be described, when the switching device IGBT is turned off in the state that a normal current flows in the switching device IGBT, In the state that a normal current flows in the switching device IGBT, since the emitter-collector voltage $V_{CE}$ of the switching device IGBT is low, the emitter-collector voltage $V_{CE}$ applied to the inverting input terminal of the comparator COMP via the diode D is lower than a reference voltage $V_{REF}$ applied to a non-inverting input terminal of the comparator COMP.

Hence, the comparator COMP outputs an output signal with a low level to the spike voltage reduction controller 430.

The spike voltage reduction controller 430 determines that the normal current is currently flowing in the switching device IGBT based upon the output signal with the low level from the comparator COMP.

After being determined that the normal current is currently flowing in the switching device IGBT, the spike voltage reduction controller 430 then outputs a transistor turn-on control signal to the base of the transistor TR12 only via the first output terminal OUT1, and thusly the transistor TR12 is turned on.

Accordingly, the gate voltage $V_{GE}$ between emitter and base of the switching device IGBT is discharged. A discharging current $I_G$ is discharged via the first fast discharge circuit section including the resistors R11, R12 and TR12, and simultaneously discharged via the idle discharge circuit section 410. Here, the waveform of the discharging current $I_G$ can refer to the waveform after time t3 in FIG. 5(a). Since the resistance of the resistor R13 of the idle discharge circuit section 410 is greater than a resistance as the sum of the resistances of the resistors R11 and R12, as can refer to the waveform after time t3 in FIG. 5(a), most of the discharging current $I_G$ is fast discharged via the one discharging path, namely, via the fast discharging path implemented by the resistors R11 and R12 and the transistor TR12. Accordingly, the turn-off time of the switching device IGBT can be prevented from being extended. Also, the spike voltage can be reduced by the resistor R13 with the great resistance.

Hereinafter, a discharging operation of the discharging control apparatus according to the present invention will be described, when the switching device IGBT is turned off in the state that an over-current flows in the switching device IGBT.

In the state that the over-current flows in the switching device IGBT, since the emitter-collector voltage $V_{CE}$ of the switching device IGBT is high, the emitter-collector voltage $V_{CE}$ applied to the inverting input terminal of the comparator COMP via the diode D becomes higher than the reference voltage $V_{REF}$ applied to a non-inverting input terminal of the comparator COMP.

Accordingly, the comparator COMP outputs an output signal with a high level to the spike voltage reduction controller 430.

The spike voltage reduction controller 430 determines that the over-current is currently flowing in the switching device IGBT based upon the output signal with the high level.

Figure 5:
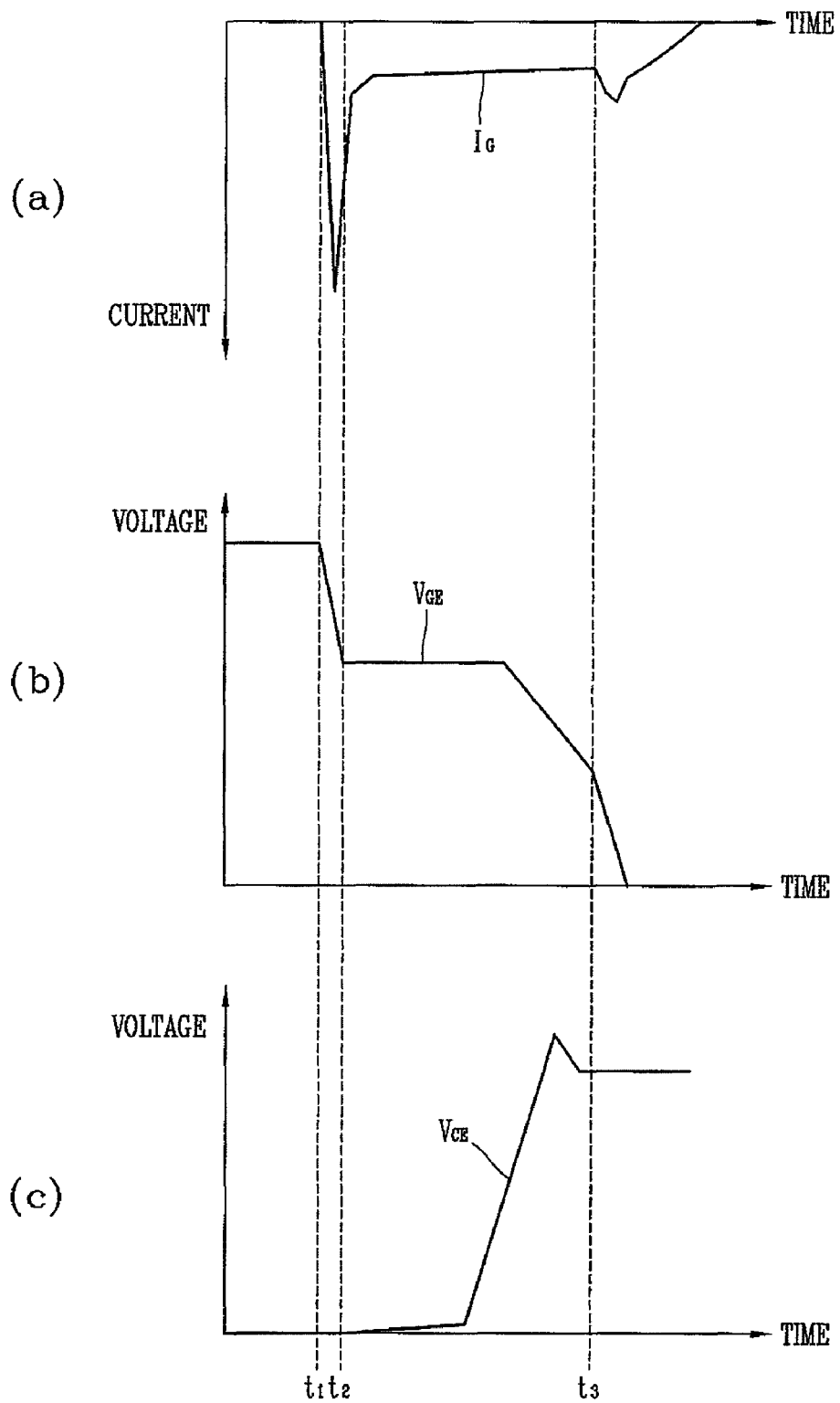
FIGS. 5a to 5c are waveform views showing an operation of a discharging control apparatus of the switching device for the inverter according to the present invention, which respectively show waveforms of gate current, emitter-gate voltage and emitter-collector voltage.

After being determined that the over-current is currently flowing in the switching device IGBT, the spike voltage reduction controller 430 then outputs a transistor turn-on control signal to the base of the transistor TR13 of the second fast discharge circuit section 440 via the second output end OUT2 for a predetermined short time from time t1 to time t2 in FIG. 5, thus to turn the transistor TR13 on. Accordingly, the emitter-base gate voltage $V_{GE}$ of the switching device IGBT is discharged, to be drastically decreased as shown in FIG. 5(b). The discharging current $I_G$ is drastically discharged to the (−) power source terminal Vee via the transistor TR13 as shown in the waveform of FIG. 5(a). The second fast discharge circuit section 440 includes the transistor TR13. Accordingly, when the transistor TR13 is turned on, there rarely exists a resistance, and thusly the fast discharge is able to be performed via the second fast discharge circuit section 440. Hence, when the over-current flows in the switching device IGBT, a damage (e.g., burnout) of the switching device IGBT due to the fast discharge can be prevented. Here, time t1 denotes a time when a low level PWM signal, which indicates to turn the switching device IGBT off is generated from the PWM signal generating circuit section 120. The switching device IGBT is not turned off yet at the short time interval predetermined from time t1 to time t2.

Afterwards, at time t2, the spike voltage reduction controller 430 stops outputting the transistor turn-on control signal provided to the base of the transistor TR13 of the second fast discharge circuit section 440 via the second output terminal OUT2.

Thus, the transistor TR13 is turned off, and the discharging path of the switching device IGBT is implemented only by the resistor R13 of the idle discharge circuit section 410.

During a predetermine time interval from time t2 to time t3, the gate voltage $V_{GE}$ of the switching device IGBT as shown in FIG. 5(b) and the discharging current $I_G$ as shown in FIG. 5(a) are gently decreased at slow speed.

The waveform of the discharging current $I_G$ in a (−) direction as shown in FIG. 5(a) is represented according to the discharge to the (−) power source terminal Vee. The switching device IGBT is turned off during the predetermined time interval from time t2 to time t3.

Afterwards, at time t3, the spike voltage reduction controller 430 outputs a transistor turn-on control signal to the base of the transistor TR12 only via the first output terminal OUT1, thus to turn the transistor TR12 on.

Hence, the residual emitter-base gate voltage $V_{GE}$ of the switching device IGBT is fast discharged as shown in the waveform after time t3 of FIG. 5(b). The discharging current $I_G$ is discharged via the first fast discharge circuit section, namely, via the resistors R11 and R12 and the transistor TR12, and simultaneously discharged via the idle discharge circuit section 410. Since the resistance of the resistor R13 of the idle discharge circuit section 410 is greater than a resistance as the sum of resistances of the resistors R11 and R12, most of the discharging current $I_G$, as can be seen in the waveform after time t3 in FIG. 5(a), is fast discharged via the one discharging path, namely, the fast discharging path implemented by the resistors R11 and R12 and the transistor TR12. Hence, the turn-off time of the switching device IGBT can be prevented from being extended. Also, since the resistor R13 has the great resistance, the spike voltage can be reduced.

The waveform of FIG. 5(c) shows the change in the emitter-collector voltage $V_{CE}$ of the switching device IGBT As can be seen in the waveform, at a substantial turn-off timing of the switching device IGBT (i.e., in the middle between t2 and t3), the voltage $V_{CE}$ is drastically increased, so as to be maintained as the DC voltage of the (+) power source terminal Vcc in the state that the switching device IGBT is turned off.

As described above, in a discharging control apparatus of a switching device for an inverter according to the present invention, when the switching device is turned off in the state that a normal current flows in the switching device, the voltage discharge can simultaneously performed both via an idle discharge circuit section having a great resistance and via a fast discharge circuit section having a small resistance. Hence, the turn-off time of the switching device cannot be extended and also a spike voltage can be reduced.

In addition, in the discharging control apparatus of the switching device for the inverter according to the present invention, when the switching device is turned off in the state that an over-current flows in the switching device, a transistor of the first fast discharge circuit section is first turned on for a predetermined time to fast discharge a discharging current, so as to advantageously prevent the damage on the switching device. Afterwards, the discharging is slowly performed for a predetermined time only via a resistor having a large resistance of the idle discharge circuit section. Finally, the residual gate voltage of the switching device IGBT is completely discharged via the first fast discharge circuit section R11, R12 and TR12. Accordingly, the spike voltage can be reduced.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A discharging control apparatus of a switching device for an inverter comprising:
    an over-current detecting circuit section configured to detect whether an over-current flows in the switching device;
    a first discharge circuit section configured to provide a discharging path through which a gate voltage of the switching device is discharged at a first discharging speed;
    an idle discharge circuit section connected to the first discharge circuit section in parallel and configured to provide a discharging path through which the gate voltage of the switching device is idly discharged at a second discharging speed slower than the first discharging speed;
    a second discharge circuit section configured to provide a discharging path through which the gate voltage of the switching device is discharged at a third discharging speed faster than the first discharging speed; and
    a spike voltage reduction controller configured to cause the gate voltage to be discharged simultaneously via the first discharge circuit section and the idle discharge circuit section when the switching device is turned off and an over-current is not flowing in the switching device,
    wherein when the switching device is turned off and an over-current has been detected by the over-current detecting circuit, the spike voltage reduction controller causes the gate voltage of the switching device to be discharged via the second discharge circuit section for a predetermined time, then causes an idle discharge of the gate voltage via the idle discharge circuit section for a predetermined time, and then causes a discharge of the gate voltage via the first discharge circuit section.

2. The apparatus of claim 1, wherein the over-current detecting circuit section comprises a comparator configured to compare a voltage between an emitter and a collector of the switching device with a predetermined reference voltage so as to detect an over-current generation.

3. The apparatus of claim 1, wherein the second discharge circuit comprises a transistor connected to the spike voltage reduction controller and configured to discharge the gate voltage of the switching device according to a control of the spike voltage reduction controller.

4. A discharging control apparatus of a switching device for an inverter comprising:
    an over-current detecting circuit section configured to detect whether an over-current flows in the switching device;
    a first discharge circuit section configured to provide a discharging path through which a gate voltage of the switching device is discharged at a first discharging speed so as to reduce a turn-off time of the switching device when the switching device is turned off;
    an idle discharge circuit section connected to the first discharge circuit in parallel and configured to provide a discharging path through which the gate voltage of the switching device is idly discharged at a second discharging speed slower than the first discharging speed, so as to reduce a spike voltage generated in the switching device when the switching device is turned off;
    a second discharge circuit section configured to provide a discharging path through which the gate voltage of the switching device is discharged at a third discharging speed faster than the first discharging speed; and
    a spike voltage reduction controller configured to cause the gate voltage to be discharged simultaneously via the first discharge circuit section and the idle discharge circuit section when the switching device is turned off and an over-current is not flowing in the switching device,
    wherein when the switching device is turned off and an over-current has been detected by the over-current detecting circuit section, the spike voltage reduction controller causes the gate voltage of the switching device to be discharged via the second discharge circuit section for a predetermined time, then causes an idle discharge of the gate voltage via the idle discharge circuit section for a predetermined time, and then causes a discharge of the gate voltage via the first discharge circuit section.

5. The apparatus of claim 4, wherein the first discharge circuit section comprises a resistor having a first resistance,
wherein the idle discharge circuit section comprises a resistor having a resistance greater than the first resistance.

6. The apparatus of claim 4, wherein the first discharge circuit section comprises a resistor having a first resistance and a transistor switched according to the control of the spike voltage reduction controller,
wherein the idle discharge circuit section comprises a resistor having a second resistance greater than the first resistance.

7. The apparatus of claim 4, wherein the over-current detecting circuit section comprises a comparator configured to compare a voltage between an emitter and a collector of the switching device with a predetermined reference voltage so as to detect an over-current generation.

8. The apparatus of claim 4, wherein the second fast discharge circuit comprises a transistor connected to the spike voltage reduction controller and configured to discharge the gate voltage of the switching device according to a control of the spike voltage reduction controller.

\* \* \* \* \*